(12) United States Patent
Deranlot

(10) Patent No.: US 10,364,481 B2
(45) Date of Patent: Jul. 30, 2019

(54) SINGLE-PHASE ALLOY OF GOLD AND TUNGSTEN

(71) Applicant: CENTRE NATIONAL DE LA RECHERCHE SCIENTIFIQUE (CNRS), Paris (FR)

(72) Inventor: Cyrile Deranlot, Paris (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 0 days.

(21) Appl. No.: 15/559,799

(22) PCT Filed: Mar. 21, 2016

(86) PCT No.: PCT/FR2016/050618
§ 371 (c)(1),
(2) Date: Sep. 19, 2017

(87) PCT Pub. No.: WO2016/151228
PCT Pub. Date: Sep. 29, 2016

(65) Prior Publication Data
US 2018/0066338 A1     Mar. 8, 2018

(30) Foreign Application Priority Data

Mar. 23, 2015 (FR) .................................. 15 52363

(51) Int. Cl.
*B32B 15/00* (2006.01)
*C22C 5/02* (2006.01)
(Continued)

(52) U.S. Cl.
CPC ............... *C22C 5/02* (2013.01); *B32B 15/01* (2013.01); *B32B 15/018* (2013.01);
(Continued)

(58) Field of Classification Search
None
See application file for complete search history.

(56) References Cited

U.S. PATENT DOCUMENTS 4,820,487 A * 4/1989 Antoniazzi ............... C22C 5/02
420/512
6,863,746 B2   3/2005 Weinstein
(Continued)

FOREIGN PATENT DOCUMENTS

CH           684616 B5    5/1995
DE          10033445    *   1/2002 ............. A61K 6/046
(Continued)

OTHER PUBLICATIONS

Sven Hamann et al.: "Synthesis of Au Microwires by Selective Oxidation of Au—W Thin-Film Composition Spreads", Science and Technology of Advanced Materials, vol. 14, No. 1, Feb. 7, 2013, p. 015003.
(Continued)

*Primary Examiner* — Seth Dumbris
(74) *Attorney, Agent, or Firm* — Harness, Dickey & Pierce, PLC

(57) ABSTRACT

A single-phase alloy is formed, as weight percentages, of N % of gold, M % of tungsten, with N+M=100, M≥8 and N≥60. Also disclosed is a process for preparing such an alloy use of such an alloy and decorative sheets made from such an alloy.

11 Claims, 2 Drawing Sheets

(51) Int. Cl.
*B32B 15/01* (2006.01)
*C23C 30/00* (2006.01)
*C23C 14/00* (2006.01)
*C23C 14/20* (2006.01)
*C23C 14/24* (2006.01)

(52) U.S. Cl.
CPC ........ *C23C 14/0005* (2013.01); *C23C 14/205* (2013.01); *C23C 14/24* (2013.01); *C23C 30/00* (2013.01)

(56) References Cited

U.S. PATENT DOCUMENTS 7,591,911 B2 * 9/2009 Senda .................. B32B 15/018
148/403

8,524,150 B2 * 9/2013 Bauer ....................... C22C 5/02
148/430

2011/0006426 A1   1/2011 Sekiguchi et al.

FOREIGN PATENT DOCUMENTS

| | | |
|---|---|---|
| EP | 1010768 A1 | 6/2000 |
| EP | 2045343 A1 | 4/2009 |
| EP | 2427582 A1 | 3/2012 |
| EP | 2450461 A1 | 5/2012 |
| JP | 2012212662 A | 11/2012 |
| WO | WO-2014-108848 A1 | 7/2014 |

OTHER PUBLICATIONS

L. Velasco et al: "The Corrosion Resistance and Microstructure of UBM System-Deposited NbxSiyNz Thin Films", Ingenieria E. Investigacion vol. 32, No. 3, Dec. 3, 2012, pp. 10-13.

* cited by examiner

SINGLE-PHASE ALLOY OF GOLD AND TUNGSTEN

CROSS-REFERENCE TO RELATED APPLICATIONS

This application is a National Phase Entry of International Patent Application Serial Number PCT/FR2016/050618, filed on Mar. 21, 2016, which claims priority to French Patent Application Serial No. 15/52363, filed on Mar. 23, 2015, both of which are incorporated by reference herein.

TECHNICAL FIELD

The present invention relates to the field of metal alloys called white gold or grey gold. White gold is an alloy used in particular in the field of jewelry because of its color in its natural state being close to that of silver—with a much higher brightness and longevity. To give it its bright and clear final color, white gold is often covered with a thin layer of a rare metal, i.e. rhodium. The white gold is a material which consists of gold in combination with other metals, usually nickel, palladium, copper, zinc.

The problem associated with the allergy caused by nickel led to the restriction or even a total ban on the presence of nickel in the white or grey gold alloy. In addition, these alloys are extremely hard and difficult to deform so that they are poorly suited to work in the field of jewelry and watches in particular.

The field of the invention is not that of two-phase or multi-phase material composed of a metal combination of two different types without single crystal structure. For a homogeneous single-phase alloy in the sense of the present invention, the addition element replaces, in the crystal structure of the base metal, an atom of the atomic lattice or intercalates into the crystal structure of the base metal. For a two-phase material, the crystalline structures of the two metals are juxtaposed to form a heterogeneous material whose mechanical and physical properties are fundamentally different from that of a homogeneous single-phase alloy even though the metal proportions are the same.

BACKGROUND

State of the Art Relating to Multi-Phase Materials

First of all, in the prior art, documents relating to the formation of two-phase materials made of gold and tungsten are known. For example, the article of SVEN HAMANN ET AL may be mentioned: "Synthesis of Au microwires by selective oxidation of Au—W thin-film composition spreads", published in SCIENCE AND TECHNOLOGY OF ADVANCED MATERIALS, vol. 14, no. 1, 1 Feb. 2013 (2013 Feb. 1), page 015003, XP055250552, ISSN: 1468-6996, DOi: 10.1088/1468-6996/14/1/015003. This publication relates to the growth of microwires formed by matrix consisting of a non-homogeneous mixture of gold and tungsten. This document never mentions the formation of a homogeneous alloy, which is not the object of the works. FIG. 1b of this prior art document further shows the dispersion in concentration of the two elements on the substrate scale: there is no composition homogeneity across the whole sample. This document never invokes the formation of a homogeneous alloy, and on the contrary shows that it leads to the preparation of samples having pure areas of gold and pure areas of Tungsten. On page 4, the last paragraph of this document, the authors admit only that at the initial state (just after deposit), the samples "the diffraction pattern in the as-deposition state (not shown) indicate the presence of pure at least one of Au and W". It's clearly the evidence that these samples are not single-phase since they contain at least these two pure phases. Their method therefore does not lead to a single-phase and homogeneous gold-tungsten alloy.

Another publication, the article of OSSI et al. may be cited: "Model of formation in ion-mixed binary alloys with positive training heats of formation", published in THE JOURNAL OF THE LESS-COMMON METALS, ESEVIER-SEQUOIA S. A. LAUSANNE, CH, vol. 160, no. 2, 1 May 1990 (1990 May 1), pages 351-362, XP024073636, ISSN: 0022-5088, DOi: 10.1016/0022-5088 (90)90393-X.

This scientific article describes experimental works related in another publication mentioned in note 19. It is the article "Ion Beam Mixing of Selected Binary Metal Systems with Large Positive Heats of Formation" of W. HILLER, M. BUCHGEISTER, P. EITNER, K. KOPITZKI, V. LILIENTHAL and E. PEINER, institute fiir Strahlen- and Kernphysik from the University of Bonn, Nussallee 14-16, D-5300 Bonn 1 (F.R.G). The referenced document exposes the manufacturing mode of the samples which are the object of this OSSI et al. article.

It consists of alternating deposits of thin layers of pure Au and W produced by vacuum evaporation (electron gun). The samples are then irradiated with a beam of ions Kr+ at 400 keV. The ion mixing is the definition of the diffusion effects of the two metals (Au and W) under the effect of the irradiation. FIG. 1 of reference 19 shows X-ray diffraction spectra before and after irradiation.

The non-irradiated state clearly shows the presence of diffraction peaks relating to Au and W, which is an evidence that the sample is not single phase. Moreover, it cannot be the case since it is to be composed of pure layer alternations of each metal. The figure of this article shows that it does not lead to the presence of a single-phase and homogeneous alloy. In addition, the arguments of the authors will be in this direction.

Relating to the preparation of materials comprising a gold phase and a tungsten phase, Japanese patent JP 2012 212662 is also known, relating to the organic electronics in which it is reported (00141) a deposit of a material of Au—W (80:20 by mass) by sputtering, leading as for the two previous documents to a heterogeneous structure. This document never mentions the production of a single-phase homogeneous alloy.

State of the Art Relating to the Materials of the "White Gold" Type

It has already been proposed in Swiss patent CH-684 616 a nickel-free grey gold alloy with good deformability, which typically includes in this case essentially between 15% and 17% by weight of palladium, 3 to 5% of magnesium and 5 to 7% by weight of copper.

Patent application EP2427582 is also known, which relates to a nickel and copper-free white gold alloy having a hardness which is particularly suitable for watchmakers and jewellers. This alloy according to the prior art consists of (in weight %): more than 75% of gold, more than 18% to less than 24% of palladium, more than 1% to less than 6% of at least one element selected from Mn, Hf, Nb, Pt, Ta, V, Zn and Zr, and if necessary, not more than 0.5% of at least one element selected from Si, Ga and Ti and optionally not more than 0.2% of at least one element selected from Ru, Ir and Re.

A white gold composition is also known from U.S. Pat. No. 6,863,746, consisting essentially of copper, silver, zinc and manganese, and further comprising low amounts of tin, cobalt, silicon/copper and boron/copper. More particularly, the white gold composition of the present invention describes a white gold composition consisting essentially of about 36% to about 57% of copper, about 10% of silver, about 18.2% to about 24.2% of zinc, about 14% to about 28.9% of manganese and the remainder being further comprised of about 1% of tin, from about 0.025% to about 0.03% of cobalt, about 0.52% of silicon/copper, and about 0.2% of boron/copper.

International patent application WO2014108848 describes an alloy composition for the production of gold alloys, more particularly white gold alloys comprising rhodium (Rh) used as a white layer component and capable of reducing the release of nickel upon the insertion of rhodium (Rh) in nickel-containing alloys. Patent application EP2045343 describes another nickel-free white gold alloy containing gallium Ga as a whitening agent.

The patent EP2450461 describes a nickel and copper-free grey gold alloy having a hardness which is particularly suitable for watchmakers and jewellers. This alloy consists of (in weight %):
more than 75% of Au;
from more than 18% to less than 24% of palladium;
from more than 1% to less than 6% of Zr;
optionally, from more than 1% to less than 6% of at least one element selected from Mn, Hf, Nb, Pt, Ta, V and Zn;
optionally, at most 0.5% of at least one element selected from Si, Ga and Ti; and
optionally, at most 0.2% of at least one element selected from Ru, Ir and Re.

Patent EP1010768 describes a nickel-free white gold alloy, in particular for the lost-wax casting technique, comprising, by weight, 75-76% of gold and 12-14% of palladium, 7-11% of Cu, between 1 and 4% of In, between 0.2 and 0.4% of Ga, the remainder being formed by a proportion of between 0.01 and 4% of at least one of the elements Ir, Re, Zn, Nb, Si, Ta, Ti.

Disadvantages

Prior art solutions have different disadvantages. These alloys have physical characteristics (density, hardness, ductility, corrosion resistance, tarnish resistance and yellowing resistance) which are not fully satisfactory. Many of these solutions use palladium, which results in good whiteness. However, it is a very expensive metal and the prices of which fluctuate greatly, leading to too soft alloys in the absence of other metals; thus, the solutions using this metal are not well-suited.

The addition of copper proposed in most prior art solutions certainly makes it possible to harden the alloys but its thermal inertia results in difficulties in casting a part and causes, during heat treatment, non-controllable hardening and cracking risk. Furthermore, the copper has an oxidation risk. For most alloys of the prior art containing Pd and/or Cu, it is necessary, to obtain the colour and brightness of the desired metal, to carry out a galvanic deposit of rhodium. The thickness of this coating (a few hundred nanometers) remains sensitive to the friction and the colour of the substrate reappears punctually, which does not allow the production of gold objects intended to last.

In order to avoid the need for a rhodium-plating, a gold alloy must ensure, according to the standard ASTM Method D1925, a value YI: D1925<19 (YI: "yellowness index"), considered as "a good white" or "premium", and integrated with the Grade 1 (see Proceedings of Santa Fe Symposium 2005, pp. 103-120). The value YI may be transposed into the CIELab system, CIE being the abbreviation of International Lighting Commission and La*b* the three coordinate axes, the L axis measuring the white-black component (black=0 and white=100), the a* axis measuring the red-green component (red=positive values, green=negative values) and the b* axis measuring the yellow-blue component (yellow=positive values, blue=negative values) (Cf. standard ISO 7724 established by the International Commission of the Illumination). The colours of the gold alloys are set in the tri-chromatic space according to the standard ISO 8654. A value YI<19 corresponds in a first approximation to $[-2 \leq a^* \leq 2; b^* < 10]$.

SUMMARY

In order to solve these drawbacks, the present invention relates to a new material of the "white gold" or "grey gold" type, consisting of a homogeneous single-phase alloy consisting, in weight %, N % of gold, M % of tungsten, with N+M=100, M≥8 and N≥60. Preferably, N≥75 and M≤24. The homogeneous and single-phase gold-tungsten alloy can be applied for uses including:
as decorative grade 1 white gold in the form of a thin film or sheet
as a sub-layer to pure gold
as a basic brick from which solid grade 1 white gold is prepared, an alternative to a nickel or palladium gold alloy.

In this latter application, the tungsten massive white gold will most likely not be homogeneous and single-phase at the end, but its color, mechanical and flowability properties will be different from those of a gold-tungsten alloy known in the prior art, ie non-homogeneous and multi-phase. Preferably, the single-phase homogeneous alloy according to the invention has a density greater than 19.2 g/cm$^3$. According to a preferred embodiment, the alloy has a face-centered cubic crystallographic structure.

The invention also relates to the use of such an alloy for producing a decorative layer, as well as for producing a decorative sheet for cold gold plating or for producing a support layer of a pure gold layer. The invention also relates to a decorative sheet consisting of a homogeneous single-phase alloy comprising, in weight %, N % of gold, M % of Tungsten, with N+M=100, M≥8 and N≥60. Optionally, this sheet is a multilayer sheet, with at least one alloy layer coated with a pure gold layer.

The invention also relates to a method for preparing a homogeneous single-phase alloy consisting of, in mass %, N % of gold, M % of Tungsten, with N+M=100, M≥8 and N≥60, comprising the steps consisting in carry-out the physical vapor deposition of gold and Tungsten, and condense the vapors of the two metals on a substrate. Preferably, said substrate is pre-coated with a sacrificial layer. According to a variant, the method comprises at least one additional step of vacuum deposition of a pure gold layer.

BRIEF DESCRIPTION OF THE DRAWINGS

The invention will be better understood from reading the following description relating to non-limiting exemplary embodiments wherein.

DETAILED DESCRIPTION

The invention relates to a single-phase alloy of gold and Tungsten, which has a crystal structure homogeneous, stable and responding, in particular for alloys with a proportion of 75% of gold and 25% of Tungsten, with the qualification of white gold predicting, according to ASTM Method D1925, a value YI: D1925<19 (YI: yellowness index) considered as "good white" or "premium", and integrated with the Grade 1

Method for Preparing

The alloy made of gold (Au) and tungsten (W) is obtained in the form of a thin film by Physical Vapor Deposition (PVD). The single-phase alloy has a tungsten mass concentration of 25% with a homogeneous distribution of tungsten atoms in gold. The resulting alloy has a density equal to that of pure gold, is biocompatible by the biocompatibility of the two elements, is harmless to the environment and easy to process.

This alloy with a composition Au75W25 exhibits a Grade 1 white gold colour, which not only does not require any additional rhodium-plating but could substitute for this rhodium-plating phase to obtain an object only comprising gold alloys. All these properties make this alloy attractive for use as a decorative layer.

On the other hand, the gold being a highly inert metal, it is difficult to stick it to surfaces. A getter material (Ta, Cr, Va, Ti) is thus often used in order to deposit a primer layer prior to the deposit of the gold layer. The AuW alloy may be used as a support for a pure gold layer that we would like to decrease the cost of starting from raw material while maintaining the density of pure gold.

The gold-tungsten alloy according to this invention is obtained by mixing the vapors of each of the metals and condensing them on a substrate. There are several PVD techniques such as thermal evaporation, sputtering, pulsed laser deposition. The disclosed example is based sputtering technique on the diode mode with a magnetron reactor and an argon (Ar) glow discharge. Other sputtering modes may be used as well as other PVD techniques (thermal evaporation, for example).

Figure 1:
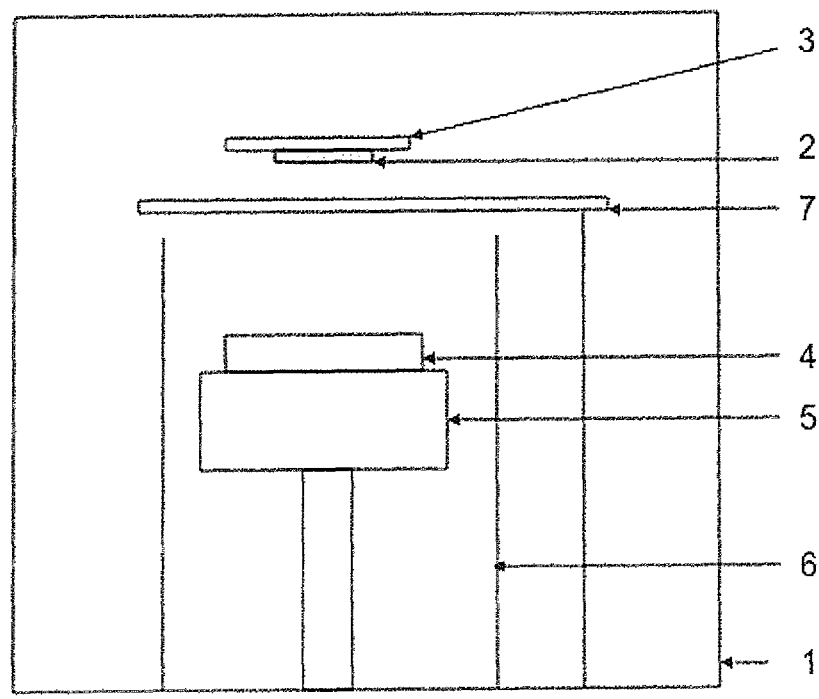
FIG. 1 is a schematic view of a facility for forming a white gold layer according to the invention.

The facility shown in FIG. 1 comprises a generally vacuum enclosure (1). The substrate (2) is mounted on its substrate holder (3) and faces the gold-tungsten target (4). This latter is installed on a magnetron reactor (5) comprising an annular magnet surrounding a cylindrical central magnet, of reverse polarity, which ensures the concomitant spraying of gold and tungsten. The plasma confining walls (6) limit its dispersion while the removable cover (shutter) (7) makes it possible to control the thickness of the decorative layer by controlling its opening time.

This technique implements a plasma to extract the material from a target of the desired material in the form of vapor. This vapor diffuses into the plasma and condenses on the substrate to form a thin film. The gold and tungsten being immiscible at the thermodynamic equilibrium, it is not possible to directly spray a target of the desired single-phase Au—W alloy, which cannot be produced by conventional physical metallurgy pathways.

Figure 2:
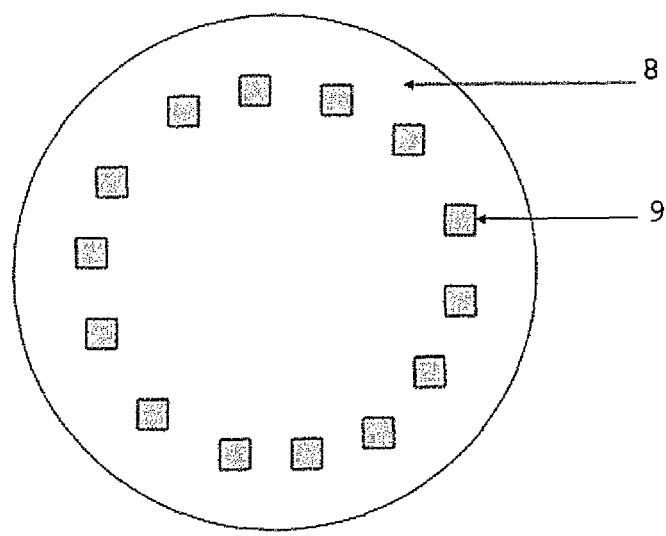
FIG. 2 is a top view of a target example for implementing the invention.

The target is thus made of a pure gold disk (8), the diameter of which substantially corresponds to the diameter of the magnetron reactor (5), and on which pure tungsten pieces (7) are arranged according to the diagram of FIG. 2. The pure tungsten pieces (7) are distributed so as to form a crown, the radius of which substantially corresponds to the median radius of the annular magnet of the magnetron.

The total surface of the tungsten pieces (7) is selected based on the parameters of the plasma discharge used to obtain an Au1-xWx alloy (x being the tungsten atomic concentration). The relationship between the tungsten surface and the atomic concentration of W is as follows:

$$x(\%at.W) = \frac{R_W S_W}{R_W S_W + R_{Au}(S_T - S_W)}$$

with $R_W$=tungsten sputtering efficiency at the discharge voltage
$S_w$=tungsten surface
$R_{Au}$=sputtering efficiency of the gold at the discharge voltage
$S_T$=total surface of the target Once the thin layer of Au-w has been obtained, its density is measured by X-ray reflectometry and in all cases, it is greater than 19.2 g/cm$^3$. The homogeneity of the alloy is characterized by electronic microscopies (scanning and/or transmission) associated with chemical analysis techniques of the EDS (Energy Dispersive Spectroscopy) or WDS (Wavelength Dispersive Spectroscopy) type. These analyses show a single chemical phase, without the presence of tungsten clusters, precipitates or aggregates.

The crystallinity of the alloy is characterized by x-ray diffraction. For all compositions, the spectrum obtained has two main peaks close to the positions relative to the planes (111) and (222) of gold. The Au—W thin layers are polycrystalline with a fiber texture (111) which means that the grains of the alloy $Au_{75}W_{25}$ have planes (111) parallel to the surface and a random orientation of these planes (111) in the plane of the thin layer. These plans (111) correspond to the dense planes of a cubic structure of the face-centered type, which is the initial structure of pure gold.

The color of the resulting thin layers is measured by spectrometry with a C-illuminant, an observation angle of 2° taking into account specular and ultraviolet components. In this configuration, the measured colors on the thin layers of the alloy $AU_{75}W_{25}$ (or 18 carats) have coordinates La*b* such as L>75, −2<a*<2 and b*<10 or indexes YI<19.

The substrate is a glass disc on which is deposited a layer of photosensitive resin, the solvent of which is acetone. The substrate is introduced into the sputtering reactor in which the target shown in FIG. 2 is placed.

The target is a pure gold disk (8) and has a diameter of 75 mm and the sum of the tungsten surface (9) is 976 mm$^2$. The plasma reactor is operated at a pressure of 2.5.10$^{-1}$ Pa of argon with a distance of 12 cm between the target and the substrate. Once the thin layer is deposited on the substrate, the latter is placed in acetone in order to dissolve the photoresist layer and thereby recover the sheet detached from the glass substrate.

Generally, the disclosed method provides for the deposit of the ad-hoc surface tungsten pieces on a gold target. A variant consists in reversing the position of each metal (tungsten target and gold pieces), taking into account the spraying efficiencies of the two metals. This variant then comprises preparing the homogeneous and single-phase gold-tungsten alloy from a tungsten target on which gold pieces are deposited. The cost of the method is reduced by the significantly lower proportion of gold which is used.

Figure 3:
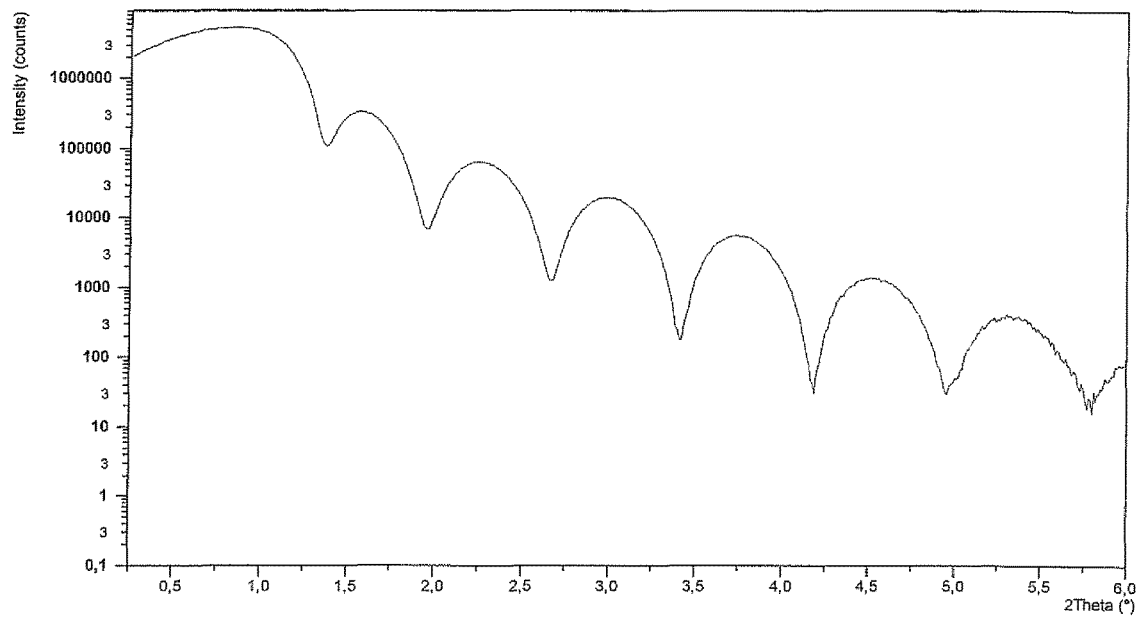
FIG. 3 illustrates an example of a X-ray reflectometry spectrum obtained on a thin layer of Au75W25 alloy.
Figure 4:
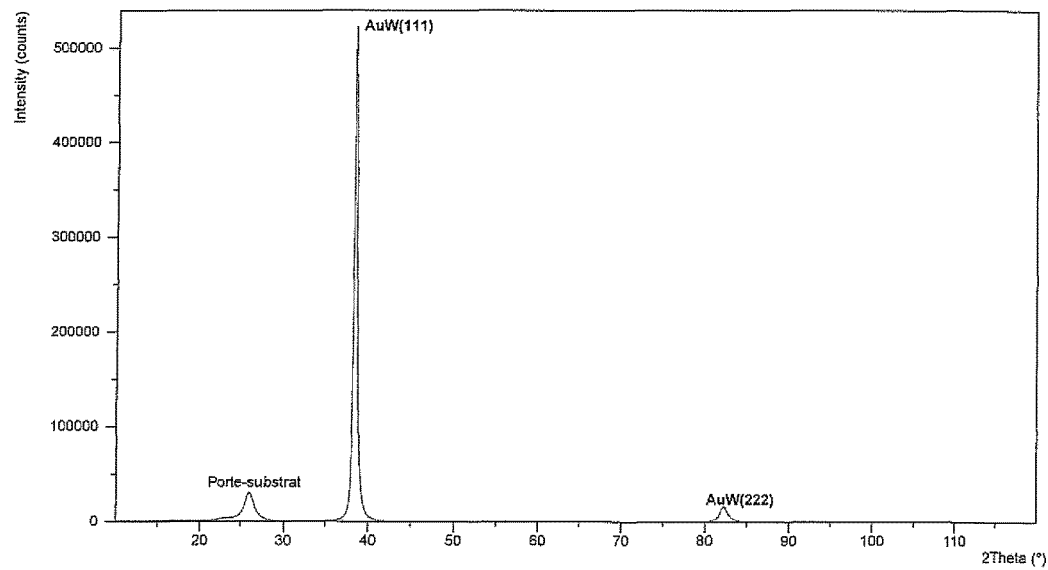
FIG. 4 illustrates an example of X-ray diffraction spectrum obtained on a Au75W25 alloy sheet.

The sheet is analyzed by X-ray reflectometry and diffraction. FIG. 3 illustrates an example of a X-ray reflectometry spectrum obtained on a thin layer of alloy Au75W25. FIG.

4 illustrates an example of X-ray diffraction spectrum obtained on a sheet of alloy Au75W25.

The invention claimed is:

1. A homogeneous single-phase alloy comprising, in weight %, N % of gold, M % of Tungsten, with N+M=100, M≥8 and N≥60.

2. The homogeneous single-phase alloy according to claim 1, wherein 92≥N≥75.

3. The homogeneous single-phase alloy according to claim 2, wherein 8≤M≤25.

4. The homogeneous single-phase alloy according to claim 3, wherein the alloy has a density greater than 19.2 g/cm$^3$.

5. The homogeneous single-phase alloy according to claim 1, wherein the alloy has a face-centered cubic crystallographic structure.

6. The homogeneous single-phase alloy according to claim 1, wherein the alloy is a decorative layer.

7. The homogeneous single-phase alloy according to claim 1, wherein the alloy is a decorative sheet.

8. The homogeneous single-phase alloy according to claim 1, wherein the alloy is a support layer of a pure gold layer.

9. A method for preparing a homogeneous single-phase alloy comprising, in weight %, N % of gold, M % of Tungsten, with N+M=100, M≥8 and N≥60, using physical vapor deposition of gold and Tungsten, and condensing vapors of the two metals on a substrate.

10. The method for preparing the homogeneous single-phase alloy according to claim 9, further comprising pre-coating the substrate with a sacrificial layer.

11. The method for preparing the homogeneous single-phase alloy according to claim 9, further comprising at least one additional step of vacuum deposition of a pure gold layer.

* * * * *